United States Patent
Jones

(10) Patent No.: US 7,552,377 B1
(45) Date of Patent: Jun. 23, 2009

(54) METHOD OF AND CIRCUIT FOR INTERLEAVING DATA IN A DATA CODER

(75) Inventor: Ben J. Jones, Edinburgh (GB)

(73) Assignee: XILINX, Inc., San Jose, CA (US)

( * ) Notice: Subject to any disclaimer, the term of this patent is extended or adjusted under 35 U.S.C. 154(b) by 742 days.

(21) Appl. No.: 11/055,288

(22) Filed: Feb. 10, 2005

(51) Int. Cl.
H03M 13/00 (2006.01)

(52) U.S. Cl. .................. 714/759; 714/702; 714/755

(58) Field of Classification Search ........... 714/702, 714/752, 755, 756, 759
See application file for complete search history.

(56) References Cited

U.S. PATENT DOCUMENTS

| | | | | |
|---|---|---|---|---|
| 6,721,908 | B1 * | 4/2004 | Kim et al. | 714/702 |
| 6,854,077 | B2 * | 2/2005 | Chen et al. | 714/702 |
| 7,137,044 | B2 * | 11/2006 | Ha et al. | 714/701 |
| 7,155,642 | B2 * | 12/2006 | Han | 714/701 |
| 7,263,037 | B2 * | 8/2007 | Haas | 368/327 |
| 2004/0220988 | A1 * | 11/2004 | Barry et al. | 708/446 |
| 2005/0044466 | A1 * | 2/2005 | Ishida | 714/755 |

OTHER PUBLICATIONS

Xilinx, Inc.; "3GPP Turbo Encoder" DS319, Product Specification, Nov. 11, 2004, pp. 1-14, available from Xilinx, Inc., 2100 Logic Drive, San Jose, 95124.

$3^{rd}$ Generation Partnership Project; Technical Specification Group Radio Access Network; Multiplexing and channel coding (FDD), 3G TS 25.212 v3.20 (Mar. 2000), Release 1999, http://www.3gpp.org, 3GPP, 650 Route des Lucioles, Sophia Antipolis, Valbonne France.

* cited by examiner

*Primary Examiner*—Esaw T Abraham
(74) *Attorney, Agent, or Firm*—John J. King

(57) ABSTRACT

According to one aspect of the invention, a method of interleaving data for enabling data coding in a communication network is disclosed, the method including storing parameters required to output address sequences for a matrix, receiving a block size associated with a block of data at a circuit for interleaving data, outputting parameters associated with the stored parameters based upon the block size, and producing an address sequence using the parameters. A circuit for interleaving data for data coding in a communication network is also disclosed. The circuit includes a lookup table storing parameters required to output address sequences for a matrix. A search coupled to the lookup table receives a clock size associated with a matrix and outputs parameters based upon the block size. A computation circuit coupled to receive the parameters outputs an address sequence using the parameters.

18 Claims, 3 Drawing Sheets

METHOD OF AND CIRCUIT FOR INTERLEAVING DATA IN A DATA CODER

FIELD OF THE INVENTION

The present invention relates generally to data processing circuits, and in particular, to a method of and circuit for interleaving data in a data coder.

BACKGROUND OF THE INVENTION

In transmitting communication signals, in a wireless communication network for example, it is often necessary to encode the data to be transmitted. The data is then decoded when it is received. Encoded data is often interleaved according to a predetermined algorithm. In order to allow for different vendors to provide equipment to operate in a communication network, standards are often developed which define an encoding scheme, and in particular, requirements for interleaving data to enable the encoding. For example, the $3^{rd}$ Generation Partnership Project (3GPP) was formed to produce Technical Specifications and Technical Reports for a 3rd Generation Mobile System based on radio access technologies.

One standard developed by 3GPP is TS 25.212 which relates to multiplexing and channel coding. The 3GPP Turbo channel code, which is a Parallel Concatenated Convolutional Code (PCCC), generates an interleaved data sequence using a Turbo code internal interleaver. The encoder defined in TS 25.212 consists of two 8-state constituent encoders and an internal interleaver. The first constituent encoder operates on the "systematic" (non-interleaved) input sequence, whereas the second operates on an interleaved version of the same sequence. In order to form the interleaved data sequence, the data are typically read from an input buffer in a permuted order according to an interleaved address sequence. The circuitry to generate these addresses is much more complex than the encoder logic, and thus forms the bulk of any Turbo encoder implementation. If this interleaver is not efficient, it may become the critical path and cause system performance to be unnecessarily reduced.

As described in Section 4.2.3.2.3 of TS 25.212 V3.2.0 Technical Specification (2000-03), Turbo coding proceeds in three stages. First, a set of matrix parameters are chosen according to the block size supplied. Then, a number of sequence vectors are initialized according to those parameters. Finally, the systematic data bits are entered into a matrix with padding, permuted according to the pre-computed sequence vectors, and then extracted transposed from the matrix with pruning. This calculation is usually re-cast in terms of the production of an interleaved address sequence, rather than operating on a physical binary-valued matrix. The algorithm for Turbo coding makes heavy use of modular arithmetic with a variable modulus, which places a heavy burden on both hardware and software implementations.

Conventional approaches to the first stage requiring parameter determination implement the equations of TS 25.212 directly. That is, the equations are implemented using hard-wired constant comparators, a lookup table of prime numbers and multiply and/or divide logic, as well as simpler elements such as adders, subtractors and counters. The branching nature of the parameter calculations makes pipelining and resource sharing difficult for the hardware designer, resulting in large, complex, slow-running designs. Further, the final stage, which is the address sequence generator itself, is described in the TS 25.212 V3.2.0 Technical Specification as a repeated indexing into a 256-element vector which is computed in the middle stage. Direct implementation of this method requires memory such as a Random Access Memory (RAM) to hold the vector, circuitry and time to perform the pre-computation, and then extra logic to perform the modulo operation on the index expression.

One difficult aspect of implementing the 3GPP Turbo code interleaver is performing a modulo operation. More specifically, the requirement to multiply an 8-bit number by a 9-bit number, modulo one of 52 9-bit primes provides a particular challenge. Various approaches can be taken. For example, the modulo operation could be performed by (i) multiplication followed by repeated subtraction/comparison, (ii) multiplication by repeated modular addition, (iii) multiplication followed by division (keeping remainder), (iv) multiplication followed by division (keeping quotient), re-multiplication and subtraction, (v) re-computation of partial modulo result, then multiplication followed by some additive reduction; or (vi) some custom "modulo multiplier" circuit. The first two of these options, which will take longer than 5 cycles, are almost certainly ruled out because of latency. The third may be possible with a sophisticated divider, but this would likely require significant area for the circuit. While option five works, it is rather slow and requires a register file for pre-computed results. Finally, option six provides no easy answer when the modulus can vary dynamically, and would be costly to implement. Accordingly, option four is the most attractive because the division can then be done using reciprocal multiplication. Although there will be three multiplications in the feedback path, they are relatively simple to implement in hardware.

By using any of these methods to implement the feedback path in 5 cycles, the circuit will run quite slowly. Alternatively, the 5 cycle requirement can be eliminated, and a faster, pipelined design, with a constraint of 10 cycles, for example, can be implemented. This gives a performance penalty for small block sizes, but works very well for a block size of 160 or over. Accordingly, there is a need for a method of and circuit for interleaving data in a data decoder which overcomes the deficiencies of conventional circuits described above.

SUMMARY OF THE INVENTION

According to one aspect of the invention, a method of interleaving data for enabling data coding in a communication network is disclosed; the method comprises steps of storing parameters required to output address sequences for a matrix; receiving a block size associated with a block of data at a circuit for interleaving data; outputting parameters associated with the stored parameters based upon the block size; and producing an address sequence using the parameters. Methods according to alternate embodiments enable intra-row permutations as an iterative process of data coding.

A circuit for interleaving data for data coding in a communication network is also disclosed. The circuit preferably comprises a lookup table storing parameters required to output address sequences for a matrix. A search circuit coupled to the lookup table receives a block size associated with a matrix and outputs parameters based upon the block size. Finally, a computation circuit coupled to receive the parameters outputs an address sequence using the parameters. According to an alternate embodiment of the invention, a circuit for interleaving data for data coding comprises a memory storing a plurality of vectors, wherein each vector is associated with a prime number. The circuit also comprises an iterative circuit coupled to the memory. The iterative circuit generates intra-row permutation patterns based upon the plurality of vectors. Finally, an address calculation circuit is coupled to receive the intra-row permutation patterns from the iterative circuit and output an address based upon the result of a previous iteration for each row of a matrix.

DETAILED DESCRIPTION OF THE DRAWINGS

The circuits and methods of the various embodiments of the present invention compute address sequences for a prime-permutation rectangular block interleaver with pruning. Because this class of interleavers is characterized by complex intra-row permutation patterns derived from modular arithmetic with prime numbers, they have been shown to be highly effective when used as the internal interleaving stage in "Turbo" channel codes, and have consequently been adopted for wireless cellular networks.

The circuits and methods of embodiments of the present invention take as their input a block size K and produce as their output a permutation of the values 0 to K−1. The circuits and methods of these embodiments take advantage of the fact that many block sizes of input data blocks have near-identical parameters, and can be grouped into contiguous ranges. Accordingly, the resulting circuits implemented comprise a ROM lookup table on which a binary search can be efficiently performed. These circuits and methods allow higher clock speeds to be achieved and consume significantly fewer device resources than conventional circuits enabling interleaving in an internal interleaving stage. Although the techniques described below provide a particular advantage in a Turbo code internal interleaver, other embodiments of the present invention could equally be applied to any other interleaver standard.

Figure 1:
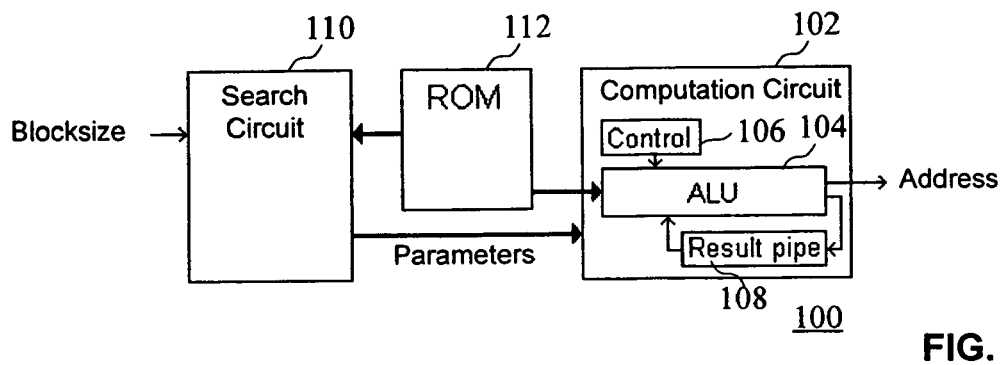
FIG. 1 is a block diagram of a circuit for interleaving data according to an embodiment the present invention.

Turning first to FIG. 1, a block diagram of a circuit 100 for interleaving data according to an embodiment the present invention is shown. In particular, a computation circuit 102 comprises a pipelined ALU 104 which performs the address calculations, a result pipeline 108 which feeds back the output of one iteration to the input of the next, and a controller 106 which schedules the operations. A more detailed implementation of the computation circuit will be described in more detail in reference to FIG. 3. The circuit 100 further comprises a searching circuit 110 which receives parameter data from a memory, such as a read only memory (ROM) 112 comprising a parameter lookup table, and outputs parameters required by the computation circuit 102 to output address sequences, as will be described in more detail below in reference to FIGS. 3-5. The searching circuit 110 will also be described in more detail in reference to FIG. 2. According to one aspect of the invention, because the searching for parameters is guaranteed to take fewer clock cycles than the address generation, the two operations can be completed concurrently. That is, while the engine is generating addresses for a block N, the searching circuit can be finding parameters for a block N+1. Both the external and internal interfaces preferably use a standard two-wire synchronous handshake to ensure that data is transferred at the appropriate time.

Figure 2:
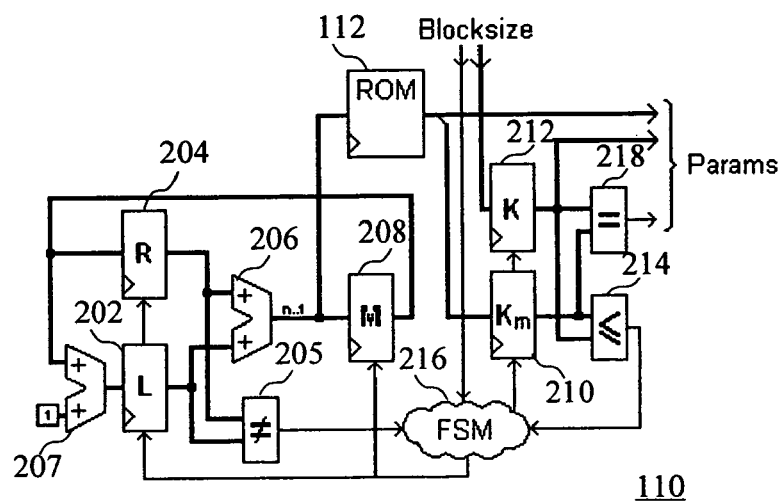
FIG. 2 is a block diagram of a searching circuit for a circuit for interleaving data according to an embodiment of the present invention.

Turning now to FIG. 2, a block diagram of a searching circuit 110 for a circuit for interleaving data according to an embodiment of the present invention is shown. The parameters used for determining an address sequence for an interleaved data sequence could include, for example, the number of rows in the matrix (R), the number of columns in the matrix (C), the prime used in the intra-row permutations (p), and the pattern of inter-row permutations (T). For each possible value of the block size K (of which there are 5074 in the TS 25.212 specification, for example), there is a corresponding set of parameter values, which is always the same for that value of K.

To accelerate the process of determining the parameters for a given value of K, it is important to note that parameters for many of the values of K are the same. In particular, there are ranges of K for which all of these matrix-defining parameters are the same. The only difference between the output sequence for these values of K is the number of entries that are pruned from the matrix. Generally, as K is increased, the matrix fills up. However, when K is too big for the matrix, the matrix is enlarged, and the process continues. For the 5047 values of K, there are 162 contiguous ranges, where each range is defined by the four parameters above (i.e. R, C, T and p), and by the maximum value of K for that range, making a lookup table implementation feasible. The procedure is to store the relevant parameters in a memory, such as a read only memory (ROM). If the circuit of FIG. 2 is implemented in a Field Programmable Gate Array (FPGA) from Xilinx, Inc., for example, the parameters would be stored in a read-only block RAM (BRAM). The correct range can be found by a binary search, which will take ceil($\log_2(162)$)=8 iterations to converge. At three clock cycles per iteration for a well-designed pipelined circuit, this takes 24 clock cycles, which is considerably less than the minimum block size of 40.

Searching circuit 110, which performs a binary search through its portion of the ROM lookup, comprises two bounds registers (left register 202 and right register 204), which are initialized to encompass the entire search range. Assuming that the values of the bound registers 202 and 204 are not equal as determined by comparator 205, the middle of the range is located by summing the current values of the bound registers 202 and 204 by way of adder 206, and dividing by two (discarding the LSB). This middle value, which is output by adder 206, is coupled to a middle register 208, and is used to index the ROM 112, from which the parameters for the corresponding range are read. The block size value retrieved from the ROM 112 and stored in block size register 210 is compared to the requested value input (block size K) coupled to requested block size register 212. The bounds are then compared and adjusted according to which is larger. That is, if the bounds are not equal as determined by comparator 214, the finite state machine 216 adjusts the left register 202 accordingly. The finite state machine 216 ensures that the registers are loaded and initialized at the appropriate times.

When the bounds become equal as determined by comparator 218, the process terminates and the parameters are dispatched to the computation circuit for further processing. Accordingly, a very fast implementation of this circuit is easily achieved, as its critical path is a 13-bit comparator carry chain.

One advantage of the present invention is that the circuit for generating parameters requires only a small amount of memory. In calculating the amount of memory for 5047 values of K, 13 bits will be needed for the maximum value of K. The prime number, p, is nominally 9 bits, but there are only 52 of them so they can be stored as a 6-bit index instead. The value of C is 9 bits. The number of rows could be either 5, 10 or 20. Because there are two T variations for the 20 rows case, an additional 2 bits are required for identifying the number of rows, making a total of 30 bits, for a total storage requirement of 4860 bits. Accordingly, the storage requirement is just over 26% of a 16 Kbit memory.

Figure 3:
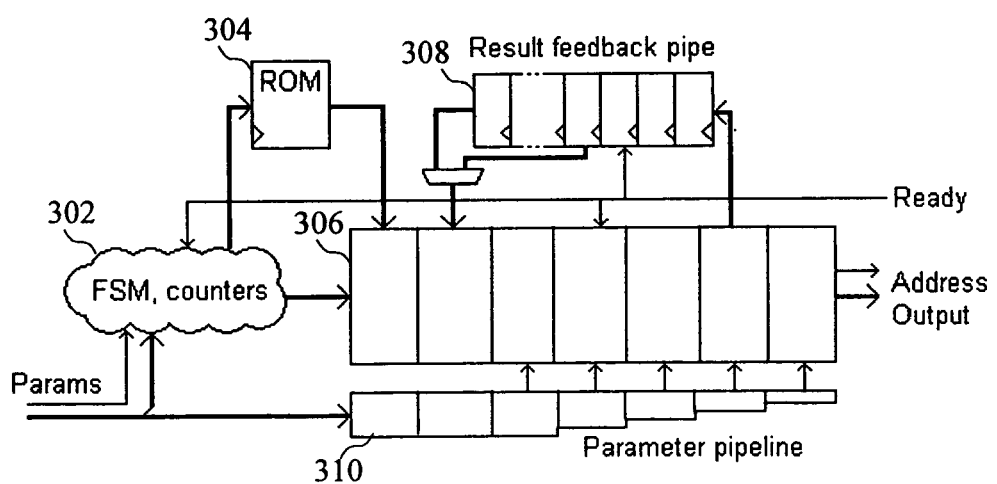
FIG. 3 is a block diagram of a computation circuit for a circuit for interleaving data according to an embodiment of the present invention.

Turning now to FIG. 3, a block diagram of a computation circuit 102 for a circuit for interleaving data according to an embodiment of the present invention is shown. The computation circuit of FIG. 3 uses two successive optimizations to simplify the implementation. First, the intra-row permutations are re-cast as an iterative process of repeated multiplication modulo one of 52 prime numbers. This allows the pre-computation (i.e. the initialization of sequence vectors in the second stage) to be eliminated and replaced with another ROM lookup table. Then, the technique of single-stage Montgomery reduction is applied to the modular multiplication, as will be described in more detail in reference to FIGS. 4 and 5. This technique allows one iteration step to be performed using just two small (8-bit×9-bit) multiply operations, an addition and a selection. The resulting design can be pipelined for very high performance.

In particular, parameters produced by searching circuit 110 are coupled by a finite state machine 302 to a ROM 304. One of these parameters is an index into the prime number table of ROM 304. This is used as a base address for all ROM lookups performed by the computation circuit. The output ROM 304 is coupled to an arithmetic logic unit (ALU) 306 having a result feedback pipe 308 and a parameter pipeline 310, which will be described in more detail in reference to FIGS. 4 and 5. The finite state machine first retrieves the chosen prime number and its inverse, and subsequent lookups retrieve the exponents used for modular exponentiation for each row in turn. The various parameter values output by ROM 304 are passed down pipeline registers of the ALU 306 to the stage of the ALU in which they are used. The state of the controlling state machine acts as an instruction issued to the ALU, determining the correct configuration of the datapath for each operation. The two lookup tables implemented in ROMs 112 and 304 could be merged into a single block memory, and the two halves of the design are operated in parallel, thus minimizing resource usage and "dead cycle" overhead between one sequence and the next.

In order to implement the circuit of FIG. 3 to comply with the TS 25.212 specification, it is necessary to comply with the requirements of the specification. Referring specifically to Section 4.2.3.2.3 of the TS 25.212 V3.2.0 Technical Specification, the Turbo code internal interleaver consists of bits-input to a rectangular matrix with padding, intra-row and inter-row permutations of the rectangular matrix, and bits output from the rectangular matrix with pruning. The bits input to the Turbo code internal interleaver are denoted by $x_1, x_2, x_3, \ldots, x_K$, where K is the integer number of the bits and takes one value of $40 \leq K \leq 5114$. The relation between the bits input to the Turbo code internal interleaver and the bits input to the channel coding is defined by $x_k = o_{i_rk}$ and $K = K_i$. The following subclause specific symbols are used in subclauses 4.2.3.2.3.1 to 4.2.3.2.3.3:

| | |
|---|---|
| K | Number of bits input to Turbo code internal interleaver |
| R | Number of rows of rectangular matrix |
| C | Number of columns of rectangular matrix |
| p | Prime number |
| v | Primitive root |
| $\langle s(j) \rangle_{j \in \{0,1,\ldots,p-2\}}$ | Base sequence for intra-row permutation |
| $q_i$ | Minimum prime integers |
| $r_i$ | Permuted prime integers |
| $\langle T(i) \rangle_{i \in \{0,1,\ldots,R-1\}}$ | Inter-row permutation pattern |
| $\langle U_i(j) \rangle_{j \in \{0,1,\ldots,C-1\}}$ | Intra-row permutation pattern of i-th row |
| i | Index of row number of rectangular matrix |
| j | Index of column number of rectangular matrix |
| k | Index of bit sequence. |

According to Section 4.2.3.2.3.1, the bit sequence $x_1, x_2, x_3, \ldots, x_K$ input to the Turbo code internal interleaver is written into the rectangular matrix by the following steps:

(1) Determine the number of rows of the rectangular matrix, R, such that:

$$R = \begin{cases} 5, & \text{if } (40 \leq K \leq 159) \\ 10, & \text{if } ((160 \leq K \leq 200) \text{ or } (481 \leq K \leq 530)) \\ 20, & \text{if } (K = \text{any other value}) \end{cases}.$$

The rows of rectangular matrix are numbered $0, 1, \ldots, R-1$ from top to bottom.

(2) Determine the prime number to be used in the intra-permutation, p, and the number of columns of rectangular matrix, C, such that:

if $(481 \leq K \leq 530)$ then, $p=53$ and $C=p$.

Otherwise the minimum prime number p is found from a table (i.e. Table 2 of Section 4.2.3.2.3 of TS 25.212) such that $$K \leq R \times (p+i),$$

and determine C such that $$C = \begin{cases} p-1 & \text{if } K \leq R \times (p-1) \\ p & \text{if } R \times (p-1) < K \leq R \times p \\ p+1 & \text{if } R \times p < K \end{cases}.$$

The columns of rectangular matrix are numbered $0, 1, \ldots, C-1$ from left to right.

(3) Write the input bit sequence $x_1, x_2, x_3, \ldots, x_K$ into the R×C rectangular matrix row by row starting with bit $y_1$ in column 0 of row 0:

$$\begin{bmatrix} y_1 & y_2 & y_3 & \cdots & y_C \\ y_{(C+1)} & y_{(C+2)} & y_{(C+3)} & \cdots & y_{2C} \\ \vdots & \vdots & \vdots & \cdots & \vdots \\ y_{((R-1)C+1)} & y_{((R-1)C+2)} & y_{((R-1)C+3)} & \cdots & y_{R \times C} \end{bmatrix}$$

where $y_k = x_k$ for $k=1, 2, \ldots, K$ and if R×C>K, the dummy bits are padded such that $y_k = 0 \text{ or } 1$ for $k=K+1, K+2, \ldots, R \times C$.

These dummy bits are pruned away from the output of the rectangular matrix after intra-row and inter-row permutations.

According to Section 4.2.3.2.3.2, intra-row and inter-row permutations must be performed. After the bits-input to the R×C rectangular matrix, the intra-row and inter-row permutations for the R×C rectangular matrix are performed stepwise by using the following algorithm with steps (1)-(6):

(1) Select a primitive root v from table 2 in section 4.2.3.2.3.1, which is indicated on the right side of the prime number p.

(2) Construct the base sequence $\langle s(j) \rangle_{j \in \{0, 1, \ldots, p-2\}}$ for intra-row permutation as:

$$s(j)=(v \times s(j-1)) \bmod p, j=1, 2, \ldots, (p-2), \text{ and } s(0)=1.$$

(3) Assign $q_0=1$ to be the first prime integer in the sequence $\langle q_i \rangle_{i \in \{0, 1, \ldots, R-1\}}$, and determine the prime integer $q_i$ in the sequence $\langle q_i \rangle_{i \in \{0, 1, \ldots, R-1\}}$ to be a least prime integer such that the greatest common divisor $(q_i, p-1)=1$, $q_i>6$, and $q_i>q_{(i-1)}$ for each $i=1, 2, \ldots, R-1$.

(4) Permute the sequence $\langle q_i \rangle_{i \in \{0, 1, \ldots, R-1\}}$ to make the sequence $\langle r_i \rangle_{i \in \{0, 1, \ldots, R-1\}}$ such that $r_{T(i)}=q_i$, $i=0, 1, \ldots, R-1$, where $\langle T(i) \rangle_{i \in \{0, 1, \ldots, R-1\}}$ is the inter-row permutation pattern defined as the one of the four kind of patterns, which are shown in table 3 of Section 4.2.3.2.3 of TS 25.212, depending on the number of input bits K.

(5) Perform the i-th ($i=0, 1, \ldots, R-1$) intra-row permutation as:

if $(C=p)$ then $U_i(j)=s((j \times r_i) \bmod (p-1)), j=0, 1, \ldots, (p-2)$, and $U_i(p-1)=0$, where $U_i(j)$ is the original bit position of j-th permuted bit of i-th row.

Otherwise, if $(C=p+1)$ then:

$U_i(j)=s((j \times r_i) \bmod (p-1)), j=0, 1, \ldots, (p-2)$,
$U_i(p-1)=0$, and $U_i(p)=p$, where $U_i(j)$ is the original bit position of j-th permuted bit of i-th row, and if $(K=R \times C)$ then $U_{R-1}(p)$ is exchange with $U_{R-1}(0)$.
Finally, if $(C=p-1)$ then:

$U_j(j)=s((j \times r_i) \bmod (p-1))-1, j=0, 1, \ldots, (p-2)$, where $U_i(j)$ is the original bit position of j-th permuted bit of i-th row.

(6) Perform the inter-row permutation for the rectangular matrix based on the pattern $\langle T(i) \rangle_{i \in \{0, 1, \ldots, R-1\}}$, where $T(i)$ is the original row position of the i-th permuted row.

Finally, according to Section 4.2.3.2.3.3, bits are output from rectangular matrix with pruning. After intra-row and inter-row permutations, the bits of the permuted rectangular matrix are denoted by $y'_k$:

$$\begin{bmatrix} y'_1 & y'_{(R+1)} & y'_{(2R+1)} & \cdots & y'_{((C-1)R+1)} \\ y'_2 & y'_{(R+2)} & y'_{(2R+2)} & \cdots & y'_{((C-1)R+2)} \\ \vdots & \vdots & \vdots & \cdots & \vdots \\ y'_R & y'_{2R} & y'_{3R} & \cdots & y'_{C \times R} \end{bmatrix}$$

The output of the Turbo code internal interleaver is the bit sequence read out column by column from the intra-row and inter-row permuted R×C rectangular matrix starting with bit $y'_1$ in row 0 of column 0 and ending with bit $y'_{CR}$ in row R−1 of column C−1. The output is pruned by deleting dummy bits that were padded to the input of the rectangular matrix before intra-row and inter row permutations (i.e. bits $y'_k$ that corresponds to bits $y_k$ with k>K are removed from the output). The bits output from Turbo code internal interleaver are denoted by $x'_1, x'_2, \ldots, x'_K$, where $x'_1$ corresponds to the bit $y'_k$ with smallest index k after pruning, $x'_2$ to the bit $y'_k$ with second smallest index k after pruning, and so on. The number of bits output from Turbo code internal interleaver is K and the total number of pruned bits is R×C−K.

According to an embodiment of the present invention, the calculation of the "s" vector could be defined recursively as:

$$s(0)=1;$$

$$s(j)=(v \times s(j-1)) \bmod p, [j=1, 2, \ldots (p-2)].$$

This can be trivially recast as $s(j)=v^i \bmod p$. Note that since the length of the s sequence is (p−1), it is not practical to pre-compute the s vector either at compile time because 52 different sequences, all of different lengths, are needed, or at run time because of the latency and/or area cost.

Referring to the q sequence, it can be seen that there is one sequence for each prime, some of which will be the same. Each sequence need only be as long as the number of rows R, but in general it is possible to compute q[0 . . . 51][0 . . . 19] at compile time and just ignore [5 . . . 19] or [10 . . . 19] if R<20. Next the q sequence is permuted to become the r sequence resulting in rows that are in a different order. Inter-row permutations according to T as defined in step 6 above undo this q-permutation.

Referring to the $U_i(j)$ computation which is the bulk of the interleaver, the TS 25.212 specification defines:

$$U_i(j)=s(j \times r_i) \bmod (p-1)), [j=0, 2, \ldots (p-2)].$$

This equation can be rewritten using the result for s above, where:

$$U_i(j) = s((j \times r_i) \bmod (p-1))$$
$$= v(j \times r_i) \bmod (p-1) \bmod p$$
$$= \left(v_i^{r_i \bmod (p-1)}\right) j \bmod p.$$

The last step takes of advantage of the knowledge that j<(p−1). This rearrangement results in a recursive definition for $U_i(j)$:

$$U_i(0)=1$$

$$U_i(j)=(U_i(j-1) \times v_i^{r_i \bmod (p-1)}) \bmod p, [j=1, 2, \ldots (p-2)].$$

Accordingly, $q_i$ can be used in place of $r_i$, and the computation and subsequent indexing of the s vector can be eliminated completely. For each of the 52 possible values of p, the 20×8-bit vector "vq"=$V^{qi \bmod (p-1)}$ mod p can be computed at compile time, with a total storage requirement of just over 8 kbit. Then, the $U_i(j)$ values can be computed on-the-fly with a single modulo-multiply for each element. This vq table and the table of primes are then the only bulk memory storage requirement. By looping over the matrix with the inner loop over R and the outer over C, the worst case is 5 clock cycles to compute $U_i(j)$ in time for its next use in the computation of $U_i(j+1)$.

Figure 4:
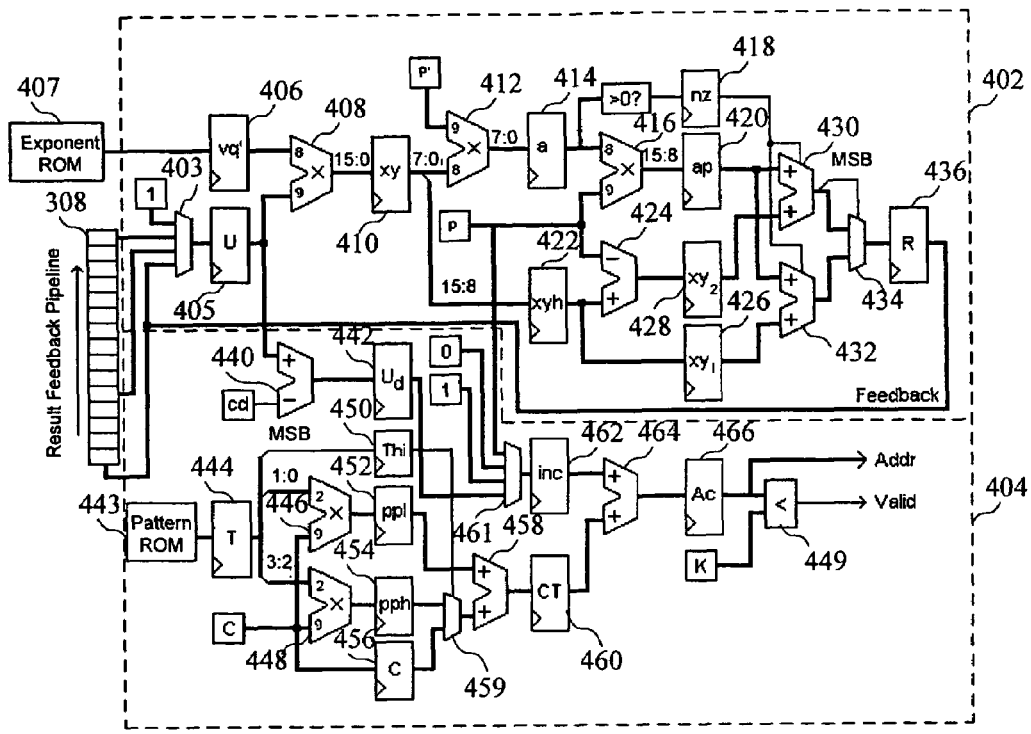
FIG. 4 is a block diagram of an arithmetic logic unit for a circuit for interleaving data according to an alternate embodiment of the present invention.

Turning now to FIG. 4, an arithmetic logic unit for a circuit for interleaving data according to an embodiment of the present invention is shown. The ALU structures of FIGS. 4 and 5 implement the modular exponentiation algorithm, where the actual addresses output are derived from the $U_i(j)$ values. For each element of the matrix, an address base is computed as C×T(i), where T is the row permutation pattern in use and C is the number of columns. $U_i(j)$ is added to this base to form the address with some exceptions, which will be described below. The circuit of FIG. 4 comprises a circuit with four multipliers, three of which are concatenated within a feedback path to generate $U_i(j)$. In contrast, the circuit of FIG. 5, which will be described in more detail below, shows a similar circuit with five multipliers, but with only two levels of multiplication within the feedback path.

Figure 5:
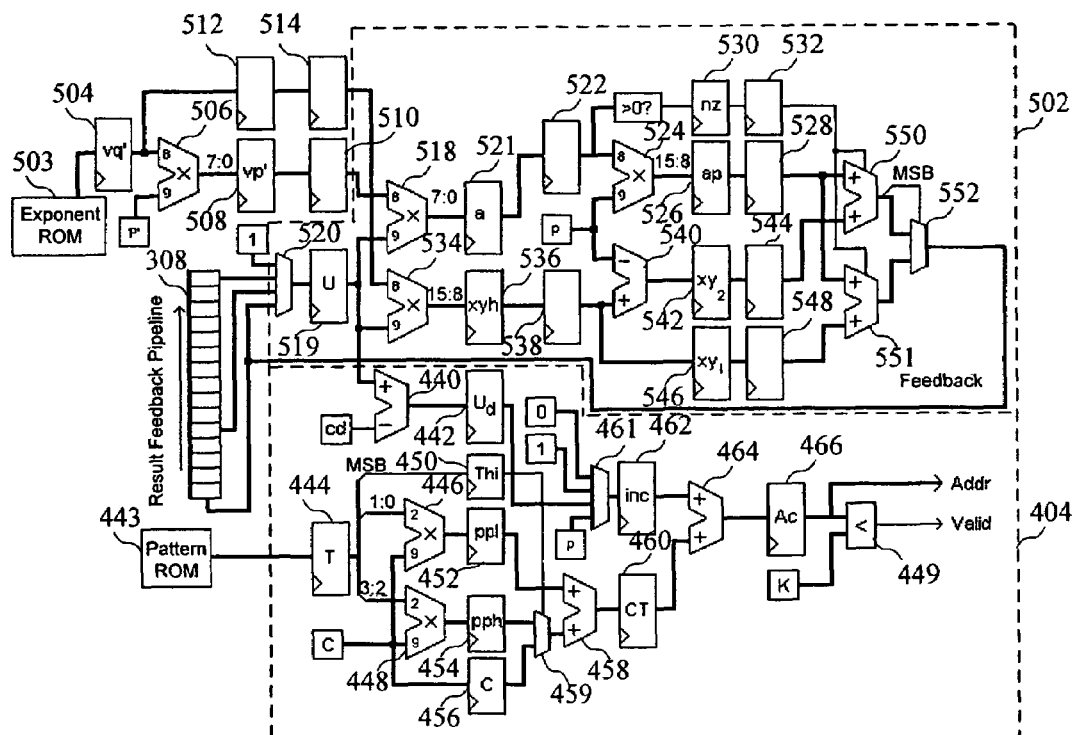
FIG. 5 is a block diagram of an arithmetic logic unit for a circuit for interleaving data according to an embodiment of the present invention.

As will be described in more detail below, the ALU design is highly pipelined, making use of the efficient shift register primitives available in Xilinx FPGA architectures, in both static and dynamic mode. The dual-port nature of the block RAM macros allows the ROM lookup table to be efficiently shared between the two independent halves of the circuit. As a result, the implementation of the embodiments of the present invention requires approximately half the size of known existing designs. The circuit of FIG. 4 is well suited for use in Virtex II Pro programmable logic devices, while the circuit of FIG. 5 is more suitable for Spartan3 architectures for example, due to the differences between the Multi 8×18 and the DSP48 blocks. Both devices are available from Xilinx, Inc. of San Jose, Calif.

In both FIGS. 4 and 5, there are two parallel paths through the ALU: one performing the iterative exponentiation (intra-row permutation) in an iterative circuit portion 402, and one calculating address values based on the result of the previous iteration for each row in an address calculation portion 404. The address calculation portion is the same for both of them. The iterative operation being performed is logically defined by the following equations:

$$U_i(0)=1$$

$$U_i(j)=(U_i(j-1)\times(v_i^{q_i mod(p-1)})) \bmod p, [j=1, 2, \ldots (p-2)],$$

where the parenthesized term involving v and $q_i$ is pre-computed. Here i is the row index, which may run from 0-4, 0-9 or 0-19 depending on the size of the matrix for the chosen block size. This places a constraint of five clock cycles to perform this modular multiplication operation. Modular arithmetic with a variable modulus usually involves division, or repetitive subtraction, neither of which will yield sufficient performance for the realization of this algorithm in hardware at high clock frequencies.

In light of this, the embodiments of the present invention introduce the novel application of the Montgomery reduction algorithm. Montgomery Reduction relates in general to a method for doing modular multiplication (and hence exponentiation) on large numbers, without ever having to divide by the modulus. It only works unmodified if the modulus m is an odd number, which is always the case for primes greater than two. In this case, some power of two is chosen as a base b, and also some value R=$b^n$ as a "reduction modulus" (R>m). Given these choices, the Montgomery Reduction algorithm computes (x×y×$R^{-1}$) mod m in which the only divisions or modulus operations are by b. These division and modulus operations are simple and require no additional hardware.

The numbers are all considered to be in base b. The Montgomery Reduction algorithm is:

A:=0.

for i from 0 to n−1 do $$u_i:=(a_0+x_i\times y_0)\times m' \bmod b.$$

$$A:=(A+x_i\times y+u_i\times m)/b.$$

if m<A then A:=A−m.

It should be noted that the value $R^{-1}$ is the multiplicative inverse of R, modulo m. A number multiplied by its inverse yields 1 (modulo m). That m is prime is a sufficient condition for the existence of this quantity. If the greatest common denominator of (R, m) is not exactly one, then there is no unique inverse. The value m' is defined as the negative multiplicative inverse of m, modulo b, which is $-m^{-1}$ or equivalently $b-m^{-1}$.

A result of using the Montgomery reduction algorithm is that it actually computes (x×y×$R^{-1}$) mod m at each stage, rather than just (x×y) mod m. Because one of the operands (for example, y) is a constant read from ROM, it is possible to pre-multiply the whole lookup table by R (modulo m). Then, (x×y×R×$R^{-1}$) mod m=x×y mod m. Note that it is also necessary to store the values of m' as well as those of m. This will be a lesser requirement than storing the reciprocal of m, which is required in conventional approaches.

While the iterative nature of the Montgomery reduction algorithm might appear to make the calculation difficult, it is possible to use just a single stage because the numbers involved are actually quite small. To do this, n is set equal to 1 and therefore b=R, essentially eliminating A, since it is always zero on input to the first stage. Accordingly, the whole operation then reduces to:

$$A:=(x\times y+((x\times y\times m') \bmod b)\times m)/b$$

if m<A then A:=A−m.

The division and modulo b operations make the implementation simpler, by allowing bits to be discarded from the multiplication results. If b=R=256 is chosen, all bit slices are 8 bits.

There are four multiplies to be seen in this formula, although x×y occurs twice and is therefore a common sub-expression. The circuit according to FIG. 4 with the three multipliers makes use of the fact that x×y occurs twice. However, if it is permissible to have four multipliers instead of just three, then one of them can be moved out of the feedback path because (x×y×m') mod b is equivalent to (x×(y×m') mod b) mod b, as will be described in reference to FIG. 5. The result (A) is being fed back to become one of the operands (x, for example) in the next calculation. Since (y×m') mod b is independent of x, it can be calculated in advance. Therefore, the circuit of FIG. 5 reduces the number of multipliers in the feedback path to two. The computation of x×y is still necessary, however, but it is now done in parallel with one of the other multiplications.

It is then necessary to design a circuit to perform the above operation. However, there are two optimizations according to the present invention which can be used to improve performance and will be described first. The first optimization relates to the algorithm itself. Because the penultimate operation is a division by b (i.e. just a left shift), the bits that are shifted off are always zero. That is, the point of the ((x×y×m') mod b)×m term is that it is designed to produce a multiple of b when added to x×y. Furthermore, if x×y is already a multiple of b, then nothing is added (because nb mod b=0).

Accordingly, it is possible to use a smaller adder, and pre-compute the carry-in bit using a simple nonzero-detect circuit. The division is then effectively pushed back by distributing it over the sum, which results in the least significant bits (LSBs) of two of the multiplications being ignored.

In particular, the first stage of the Montgomery reduction procedure is shown as follows:

$$A:=(x \times y+((x \times y \times m') \bmod b) \times m)/b.$$

Because the expression (x×y+((x×y×m')mod b)×m) is guaranteed to be a multiple of b, due to the properties of m and m', the final division by b does not actually cause any non-zero digits to be discarded. For a decimal example, consider that the division 253000/1000 is equal to 253. The number being divided by b is the sum of two terms, (x×y) and ((x×y×m')mod b)×m). For this sum to be a multiple of b, which is 256, its bottom 8 binary bits must be zero. The second term (in m and m') ensures that the bottom 8 binary bits are zero. If the bottom 8 bits are always going to be zero, the logic to compute these zeroes is unnecessary. This bottom part of the sum has no side effects, except to produce a carry into the top part of the sum.

Further, there are only two possible scenarios with regard to these bottom bits:

(1) (x×y) is already a multiple of b. In this case, (x×y×m') mod b will be zero, and the whole second term disappears (i.e. nothing is added to x×y), or (2) (x×y) is NOT a multiple of b. In this case, the second term does affect the equation.

In scenario 1, the x×y term remains untouched (i.e. no carry). In scenario 2, there is always a carry-in to the top half of the adder; this is equivalent to adding one to the top half. Referring back to the decimal example: 253197+803=254000, if it is known that 803 was deliberately chosen to make 1000 when added to 197, the computation of those three digits can be avoided, and instead one can be added to 253 to get 254. According to another example: 253662+338=254000, by exactly the same principle. When deciding whether to add one or not, there is some flexibility in deciding where to put the zero-detection. ((x×y×m')mod b)×m itself can be checked, or just (x×y×m')mod b, or even just (x×y)mod b. (x×y×m') mod b is preferably chosen because it is the most convenient for the circuitry (i.e. it gives the nz result at just the right time during the processing cycle).

The second optimization is for the final compare-subtract-select operation for the second half of the Montgomery reduction. Without care, this operation can become the critical path because there are potentially two carry chains and a multiplexor. To avoid this, m can be subtracted in advance from one of the operands of the addition, and the addition can be done twice and in parallel. This results in the two candidate values A and A−m. Choosing the non-negative result obviates the comparator and brings the critical path down to one carry chain plus a multiplexor.

Accordingly, the second optimization is:

if $m<A$ then $A:=A-m$.

While this implies a comparison, a selection and a subtraction, the comparison and the subtraction can be combined into one operation. The "xyh" register contains (x×y)/b (cf. 253000/1000=253). The "ap" register contains ((x×y×m') mod b)×m)/b. The sum of these two values (and nz) gives us the "A" in the formula above. Accordingly:

$$A:=xyh+ap+nz$$

if (m<A) then
   Result :=A−m
else
   Result:=A
end if

If A >=m, m is subtracted from A to get it into the range (0 . . . m−1). If A is already in this range, subtracting m from A would yield a negative result. Accordingly:

$$A1:=xyh+ap+nz$$

$$A2:=A1-m$$

if (A2<0) then
   Result:=A1
else
   Result:=A2
end if

It can be seen that this is equivalent, given the knowledge that xyh+ap+nz is always less than 2m−1. As it is, this makes the comparator redundant, because the way binary numbers are represented means that testing for negativity is simple (i.e. the most-significant bit of the number is always set if it is negative). However, because there is still some processing to do in order to get from A1 to the result, the subtraction of m is performed earlier:

$$xy1:=xyh$$

$$xy2:=xyh-m$$

$$A1:=xy1+ap+nz$$

$$A2:=xy2+ap+nz$$

if (A2<0) then
   Result:=A1
else
   Result:=A2
end if

While it takes considerable time to generate ap because it is the result of those three multiplies, xyh is calculated early on. Thus, the subtraction can be done in parallel with one of the multiplications. While an extra adder (one for A1, and one for A2) is required, that is a trivial cost.

Accordingly, the application of the Montgomery reduction algorithm allows the above equation for $U_i(j)$ to be re-expressed as:

$$U_i(j)=(U_i(j-1) \times vq'+((U_i(j-1) \times vq' \times p') \bmod b) \times p)/b.$$

if $U_i(j)>=p$ then $U_i(j):=U_i(j)-p$, where b is the chosen modular reduction base (in this case, $2^8=256$), p is the prime number chosen during parameter selection, p' is the negative multiplicative inverse of the prime number modulo b, and vq' is $(b \times (v^{q_i \bmod p-1})) \bmod p$. This last expression defines the exponent values that are pre-computed and stored in an exponent ROM. Performing multiplications modulo the base b, and also dividing by b, are now trivial operations because b is a power of two. This simplification allows practical implementation of the above equation in five short clock cycles, resulting in a factor-of-two improvement over existing techniques.

It can be seen from the above formula that the expression $U_i(j-1) \times vq'$ is required twice. The choice of whether or not to duplicate this operation gives rise to the two ALU structures of FIGS. 4 and 5. If the multiplication is performed only once, then the total number of multiplications in the iterative formula is three, as shown in FIG. 4. However, all three of these operations must be performed sequentially within the five clock cycle feedback path in the iterative circuit portion 402. If it is not practical to perform these operations in the five clock cycles, then the circuit of FIG. 5 can be used. As was described in more detail in reference to FIG. 5, the three-operand multiplication modulo b is re-ordered so that vq' is pre-multiplied by p'. This operation can then be performed outside the feedback path, and the remaining two multiplications by $U_i(j-1)$ can be performed in parallel. This allows more extensive pipelining of the multipliers (and thus better performance in some technologies) at the expense of an extra multiplication.

The elements of the circuit of FIG. 4 not only implement the algorithm described above, but also implement the various optimizations. In particular, the iterative circuit portion 402 comprises a multiplexer 403 coupled to receive outputs of the feedback pipeline 308, and generates an output to a U vector register 405. A vq' register 406 stores a value from an exponent ROM 407, which stores pre-computed vq' values in an exponent vector lookup table. The outputs of the U vector register 405 and the vq' register 406 are coupled to a multiplier 408, the result of which is coupled to an xy register 410. A second multiplier 412 receives the xy value and p', and generates a result coupled to a register 414. Finally, a third multiplier 416 receives the output of the register 414 and p. An nz register 416 is coupled to receive the output of the register 414 if the output is greater than zero. In a parallel path, the output of the xy register 410 is coupled to an xy high (xyh) register 422, the output of which is coupled to a subtractor 424 which subtracts the value p. The output of xyh register 422 is coupled to an xy$_1$ register 426, while the output of the subtractor 424 is coupled to an xy$_2$ register 428. Adder circuits 430 and 432 are coupled to the nz, ap, xy$_1$, xy$_1$ registers, and the output of which is selected by a multiplexer 434 and stored in a register 436. The data stored in register 436 is feedback to the feedback pipeline 308, as described above.

Accordingly, the iterative circuit portion 402 of FIG. 4 implements the following algorithm:

for (all columns in matrix) do
    // initialization:
    R:=(1, 1, 1, . . . , 1)
    for (each row r) do
        // step 1:
        U[r]:=R[r]
        vq':=vq'_rom[r]
        // step 2:
        xy:=(vq' mod 256)*U[r]
        // step 3:
        a:= (xy*p') mod 256
        xyh:=xy/256
        // step 4:
        if (a>0) then nz:=1 else nz:=0 end if
        ap:=(a*p)/256
        xy1:=xyh;
        xy2:=xyh-p;
        // step 5:
        cand1:=ap+xy1+nz
        cand2:=ap+xy2+nz
        if (cand2<0) then R[r]:=cand1 else R[r]:=cand2 end if
    end for
end for The pipelining of the design allows the computation for the different rows to be overlapped. That is, while step 3 is being performed for row 0, step 2 is being performed for row 1 and step 1 for row 2, and so on. Thus, even though the calculation described takes five clock cycles (one per step), it is possible to produce a new result every cycle. The application of this technique is limited only by the dependencies between different stages of the computation. It should be noted that each step only uses variables from the same step or the previous step (plus p and p', which are constants throughout the entire computation). Accordingly, the only significant dependency is that the result of step 5 is needed as an input to step 1 (i.e. the feedback path).

The address value calculation performed in the address calculation portion 404 transforms the $U_i(j)$ values (representing the intra-row permutation patterns output by U register 405 of iterative circuit portion 402) into absolute addresses by adding in the effect of the inter-row permutations and making certain other adjustments according to the requirements of the TS 25.212 specification. The main operation is to calculate the value $C \times T(i)$, where C is the number of columns in the matrix and T(i) is the original row position of the i-th permuted row. That is, the output of U register 405 is coupled to a subtractor 440 which subtracts a value cd, and couples an output to a Ud register 442. The values of T(i) are retrieved from a small row position lookup table, Pattern Rom 443, according to the current row and the chosen permutation pattern and stored in T register 444. The multiplication is simplified by knowledge of the bounds of C and T(i), and so a full multiplier block is not required. The resulting circuit has two constituent 2×9 multipliers. In typical programmable logic device technology, these are the same size and approximately the same speed as a 9-bit adder, which is relatively small. The two "partial product" multipliers 446 and 448 are 2×9 bits, which can be implemented very efficiently in logic of a programmable logic device.

The outputs of the multipliers 446 and 448 are coupled to a plurality of registers Thi 450, ppl 452, and pph 454, which along with the C register 456 implement the following equations:

$$Thi = T/16$$

$$ppl = (T \bmod 4)*C$$

$$pph = ((T/4) \bmod 4)*C$$

if (Thi==0) then
    CT=ppl+4*pph
else
    CT=ppl+16*C.
end if

An adder 458 receives the output of a multiplexer 459, which is coupled to pph register 454 and C register 456. It can be seen that:

$$(x+y+z)*c = x*c + y*c + z*c.$$

The binary representation of T is split into three parts, by taking the bottom two bits, the next two bits, and the top bit all separately. According to the above equation, it is only necessary to multiply them individually and add the results, as can be seen in the following example in decimal:

273*6=200*6+70*6+3*6=1200+420+18=1638.

The optimization relies on the knowledge that T cannot be greater than 19. Here are the possible valid values of T in binary and decimal, and the resulting three-part decomposition:

| T(dec) | T(bin) | Th | Tm | Tl |
|---|---|---|---|---|
| 0  | 00000 | 0 | 00 | 00 |
| 1  | 00001 | 0 | 00 | 01 |
| 2  | 00010 | 0 | 00 | 10 |
| 3  | 00011 | 0 | 00 | 11 |
| 4  | 00100 | 0 | 01 | 00 |
| 5  | 00101 | 0 | 01 | 01 |
| 6  | 00110 | 0 | 01 | 10 |
| 7  | 00111 | 0 | 01 | 11 |
| 8  | 01000 | 0 | 10 | 00 |
| 9  | 01001 | 0 | 10 | 01 |
| 10 | 01010 | 0 | 10 | 10 |
| 11 | 01011 | 0 | 10 | 11 |
| 12 | 01100 | 0 | 11 | 00 |
| 13 | 01101 | 0 | 11 | 01 |
| 14 | 01110 | 0 | 11 | 10 |
| 15 | 01111 | 0 | 11 | 11 |
| 16 | 10000 | 1 | 00 | 00 |
| 17 | 10001 | 1 | 00 | 01 |
| 18 | 10010 | 1 | 00 | 10 |
| 19 | 10011 | 1 | 00 | 11 |

Notice that whenever the most-significant bit of T (Th) is 1, then the two middle bits (Tm) are zero. Referring to the x*c+y*c+z*c identity, this means that x and y (for example) will never be non-zero simultaneously. Consequently, it is never necessary to add both (x*c) AND (y*c) to obtain the result, because if one of them is non-zero then the other must be zero. It can be seen that Thi corresponds to Th in the table above. Tl is multiplied by C to give ppl, and Tm is multiplied by C to give pph. At the next stage, if Thi is zero then we add pph and ppl to get the result. If Thi is non-zero, we add ppl and C (shifted left by four binary places) to get the result. Because all these multiplications, divisions and modulo operations with 4s and 16s only require shifting and extracting bits, no additional hardware is required.

Once C×T(i) has been computed it is modified by an output of a multiplexer 461 coupled to an inc register 462. That is, the output of an adder 464 and stored in a register 466 is then compared to the block size K by a comparator 449, and is output if it is in the range 0-(K−1); otherwise, it is "pruned" and no output occurs. The usual modification of adding $U_i(j)$ is sometimes overridden, depending on the exact parameters of the matrix. When C<p, the value is decremented by one. When C>=p, there are additional columns to be processed in which the values 0 and p are added instead of the $U_i(j)$ values computed for the main body of the matrix. Finally, under certain conditions two elements of the matrix are exchanged. Since the circuit is expected to output the sequence in linear order and cannot modify its results retrospectively, this condition is detected in advance and one of the alternative modifications to C×T(i) is used for these elements. Fortunately, the lookup table arrangement of an embodiment of the present invention provides an easy test. If the desired value of K is exactly equal to the value of Kmax stored in the ROM, then the block size lies at the top of the current range, and so the matrix must be full. Although this is generally true, there is a case where this is not true; namely, when the number of rows changes from 5 to 10, at Kmax=159. For a block size of 160, a 16×10 matrix is used in preference to a 32×5 one. This case can be easily detected, by observing:

If C>p then C=p+1, so C is an even number; and

If C is even then C×R is also even.

Thus the exchange happens if K=Kmax AND C>p AND K mod 2=0. Because certain aspects of the matrix processing rely on knowledge of the relationship between C and p, which can differ by −1, 0 or +1, a pair of flags indicating the difference between C and p can be stored, avoiding a pair of comparators. This optimization makes the per-range storage requirement 32 bits.

For the address generation. circuit 404, a simplified algorithm can be represented as follows:

for (all columns) do
  for (each row r) do
    Ud:=U[r]−cd
    CT:=C*T[r]
    case (operation) is
      when OP0: inc:=0
      when OP1: inc:=1
      when OPP: inc:=p
      when OPU: inc:=Ud
    end select
    Ac:=CT+inc
    if (Ac <K) then
      Output Ac as the next address in the sequence
    end if
  end for
end for In this algorithm, the values "cd" and "operation" are supplied by the state machine that controls the calculation. Because there is no backwards dataflow in the circuit portion 404, the pipelining technique can be applied arbitrarily. Also, rather than using Thi, ppl and pph which enables more efficient multiplication in the hardware available, the these registers could be replaced with a 5×9 multiplier (CT := C*T[r]), where T is an array containing the inter-row permutation pattern for the current matrix, as described in Section 4.2.5.2 of the TS 25.212 specification.

FIG. 5 is a block diagram of an arithmetic logic unit for a circuit for interleaving data according to an alternate embodiment of the present invention. As set forth above, the expression $U_i(j-1) \times vq'$ is required twice. If it is not practical to perform the required multiplications in the five clock cycles, then the circuit of FIG. 5 can be used. The three-operand multiplication modulo b is re-ordered so that vq' is pre-multiplied by p'. This operation can then be performed outside the feedback path, and the remaining two multiplications by $U_i(j-1)$ can be performed in parallel. This allows more extensive pipelining of the multipliers (and thus better performance in some technologies) at the expense of an extra multiplication.

In particular, the Exponent ROM 503, which stores pre-computed vq' values, is coupled to a vq' register 504, the output of which is coupled to a multiplier 506 which also receives p'. The output of the multiplier is coupled to a vp' register 508 which has a pipeline register 510. The output of vq' 504 is also coupled to a series of pipeline registers 512 and 514. A first multiplier 518 is coupled to receive the output of vq' and the U register 519. The output of the multiplier 518 is coupled to a register 521, which is coupled by way of a pipeline register 522 to another multiplier 524. The output of the multiplier 524 is coupled to an ap register 526 and a corresponding pipeline register 528. A second multiplier 534 running in parallel with the first multiplier 518 receives the output of the vq' register 504 and the output of the U register 519. The multiplier 534 couples an output to an xyh register 536 and a corresponding pipeline register 538. A subtractor 540 subtracts p from the output of the pipeline register 538 and couples the result to an $xy_2$ register 542 and a corresponding pipeline register 544. The output of the pipeline register 538 is also coupled directly an $xy_1$ register and a corresponding pipeline register 548. Adder circuits 550 and 551 receive the outputs of the nz, ap, $xy_1$, and $xy_2$ registers, the outputs of which are selected by a multiplexer 552. The output of the multiplexer 552 couples a feedback signal to the feedback pipeline 308.

The following is an algorithm implemented by the iterative portion 502 of FIG. 5:

for (all columns in matrix) do
  // initialization:
  R:=(1, 1, 1, . . . , 1)
  for (each row r) do
    // step 1:
    U[r]:=R[r]
    vp':= (vq'_rom[r]*p') mod 256
    // step 2:
    a:=(vp'*U[r]) mod 256
    xyh:=(vq'rom[r]*U[r])/256
    // step 4:
    if (a>0) then nz:=1 else nz:=0 end if
    ap:=(a*p)/256
    xy1:=xyh;
    xy2:=xyh−p;
    // step 0.9:
    cand1:=ap+xy1+nz
    cand2:=ap+xy2l+nz
    if (cand2<0) then R[r]:=cand1 else R[r]:=cand2 end if
  end for
end for Notice that steps 3 and 5 are no longer required, as they correspond to these additional pipeline stages. That is, the multiplication operations is spread over two steps, instead of being combined into one. In some devices, this allows the circuit to run faster. The value C is a 9-bit number, valued between 8 and 256 inclusive. The value T is a 5-bit number, valued between 0 and 19 inclusive. Because these dimensions (5×9) are difficult for building a multiplier circuit (i.e. they are both one more than a power of 2 (4+1=5 and 8+1=9)), the circuit has been optimized to make the circuit smaller than it might otherwise be.

Figure 6:
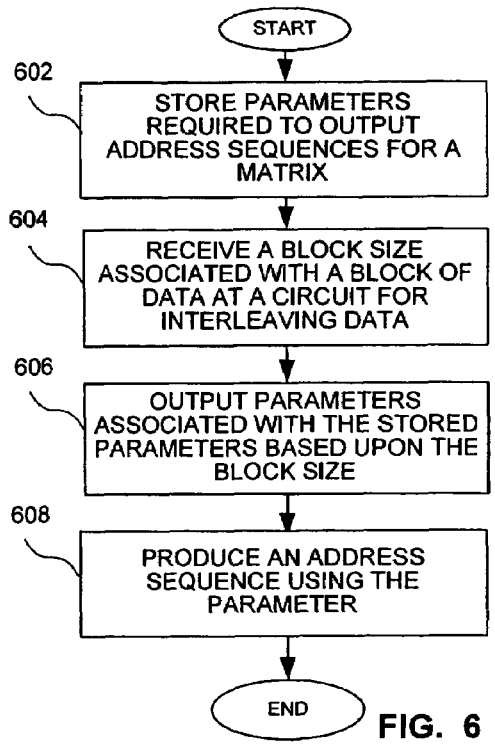
FIG. 6 is a flow chart showing a method of outputting parameters based upon a block size according to an embodiment of the present invention.

Turning now to FIG. 6, a flow chart shows a method of outputting parameters based upon a block size according to an embodiment of the present invention. The method of FIG. 6, as well as the method of FIG. 7 below, could be implemented using the circuits of FIGS. 1-5 described below. Parameters required to output address sequences for a matrix are stored in a memory at a step 602. A block size associated with a block of data at a circuit for interleaving data is received at a step 604. Parameters associated with the stored parameters based upon the block size are output at a step 606. Finally, an address sequence using the parameters is produced at a step 608.

Figure 7:
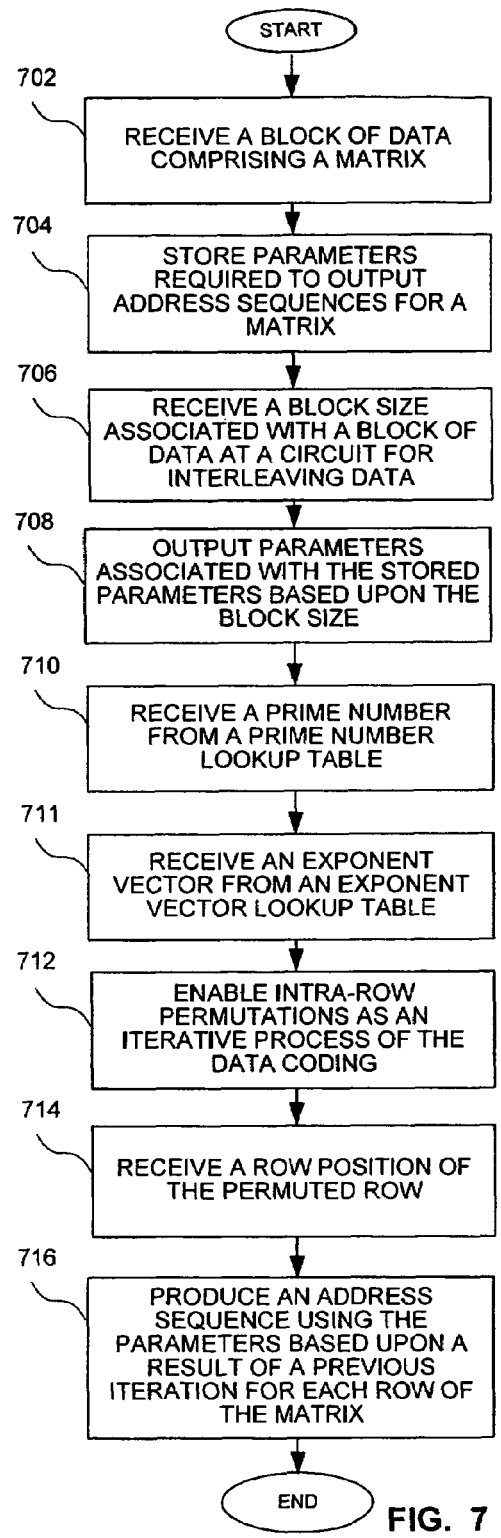
FIG. 7 is a flow chart showing a method of producing address sequences based upon an iterative process of intra-row permutations according to an embodiment of the present invention.

Finally, turning to FIG. 7, a flow chart shows a method of producing address sequences based upon an iterative process of intra-row permutations according to an embodiment of the present invention. A block of data comprising a matrix is received at a step 702. Parameters required to output address sequences for a matrix are stored at a step 704. A block size associated with a block of data at a circuit for interleaving data is received at a step 706. Parameters associated with the stored parameters based upon the block size are output at a step 708. A prime number from a prime number lookup table is received at a step 710. An exponent vector from an exponent vector lookup table is received at a step 711. Intra-row permutations are enabled as an iterative process of the data coding at a step 712. A row position of the permuted row is received at a step 714. Finally, an address sequence using the parameters based upon a result of a previous iteration is produced for each row of the matrix at a step 716.

It can therefore be appreciated that the new and novel circuit and method of interleaving data in a data coder has been described. Although specific reference is made to the 25 TS 212 specification of the 3GPP, similar procedures would be required for the implementation of other interleavers based on the same number-theoretic foundations. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of interleaving data for enabling data coding in a communication network, said method comprising the steps of:
    storing parameters required to output address sequences for a matrix, wherein said parameters are associated with ranges of block sizes for which said parameters are the same;
    receiving a block size associated with a block of data at a circuit for interleaving data;
    outputting one or more of said parameters based upon said block size, wherein said step of outputting one or more parameters comprises outputting one or more parameters associated with a range of block sizes having said block size associated with said block of data received at said circuit for interleaving data; and
    producing an address sequence using said one or more parameters.

2. The method of claim 1 wherein said step of outputting one or more parameters comprises a step of performing a binary search in a lookup table.

3. The method of claim 1 further comprising a step of enabling intra-row permutations as an iterative process.

4. The method of claim 3 further comprising a step of providing a prime number lookup table, wherein said step of enabling intra-row permutations comprises receiving a prime number from said prime number lookup table.

5. A method of interleaving data for enabling data coding in a communication network, said method comprising the steps of:
    receiving a block of data comprising a matrix and having a block size;
    receiving a prime number from a memory;
    enabling intra-row permutations as an iterative process of said data coding; and
    producing an address sequence, said address sequence based on one or more parameters generated for a range of block sizes having said block size and for which said parameters are the same.

6. The method of claim 5 wherein said step of enabling intra-row permutations comprises a step of calculating address values based upon a result of a previous iteration for each row of said matrix.

7. The method of claim 6 further comprising a step of storing parameters required to output address sequences for said matrix.

8. The method of claim 7 further comprising a step of receiving said block size associated with said block of data at a circuit for interleaving data.

9. The method of claim 8 further comprising a step of outputting one or more of said parameters based upon said block size.

10. A circuit for interleaving data for data coding in a communication network, said circuit comprising:
- a memory storing parameters required to output address sequences for a matrix, wherein said parameters are associated with ranges of block sizes for which said parameters are the same;
- a searching circuit coupled to said memory, said searching circuit receiving a block size associated with said matrix and outputting parameters based upon said block size, wherein said outputting parameters comprises outputting one or more parameters associated with a range of block sizes having said block size associated with said matrix; and
- a computation circuit coupled to receive said parameters and output an address sequence using said parameters.

11. The circuit of claim 10 wherein said computation circuit comprises an arithmetic logic unit.

12. The circuit of claim 11 further comprising a prime number lookup table coupled to said arithmetic logic unit.

13. The circuit of claim 12 further comprising a feedback path enabling intra-row permutations based upon a result of a previous iteration for each row of said matrix.

14. The circuit of claim 13 wherein said computation circuit further comprises a row position lookup table.

15. A circuit for interleaving data for data coding in a communication network, said circuit comprising:
- a memory storing a plurality of vectors, each of said plurality of vectors being associated with a prime number;
- an iterative circuit coupled to said memory, said iterative circuit generating intra-row permutation patterns based upon said plurality of vectors;
- an address calculation circuit coupled to receive said intra-row permutation patterns from said iterative circuit, said address calculation circuit outputting an address based upon a result of a previous iteration for each row of a matrix; and
- a lookup table storing parameters required to output address sequences for said matrix, said parameters being associated with ranges of block sizes for which said parameters are the same, where said parameters are output to the address calculation circuit for a range of block sizes having a block size of data in said matrix.

16. The circuit of claim 15 further comprising a result feedback pipeline coupled to an output of said iterative circuit.

17. The circuit of claim 15 further comprising a prime number lookup table coupled to said iterative circuit.

18. The circuit of claim 15 further comprising a row position lookup table coupled to said address calculation circuit.

* * * * *